United States Patent
Zhu et al.

(10) Patent No.: US 10,446,732 B2
(45) Date of Patent: Oct. 15, 2019

(54) NBFESB-BASED HALF-HEUSLER THERMOELECTRIC MATERIALS AND METHODS OF MAKING

(71) Applicant: ZHEJIANG UNIVERSITY, Hangzhou, Zhejiang Province (CN)

(72) Inventors: Tiejun Zhu, Hangzhou (CN); Chenguang Fu, Hangzhou (CN); Xinbing Zhao, Hangzhou (CN)

(73) Assignee: ZHEJIANG UNIVERSITY, Hangzhou (CN)

(*) Notice: Subject to any disclaimer, the term of this patent is extended or adjusted under 35 U.S.C. 154(b) by 445 days.

(21) Appl. No.: 14/900,132

(22) PCT Filed: May 27, 2014

(86) PCT No.: PCT/CN2014/078513
§ 371 (c)(1),
(2) Date: Dec. 18, 2015

(87) PCT Pub. No.: WO2015/180034
PCT Pub. Date: Dec. 3, 2015

(65) Prior Publication Data
US 2016/0141480 A1 May 19, 2016

(51) Int. Cl.
*H01L 35/18* (2006.01)
*H01L 35/34* (2006.01)

(52) U.S. Cl.
CPC .............. *H01L 35/18* (2013.01); *H01L 35/34* (2013.01)

(58) Field of Classification Search
None
See application file for complete search history.

(56) References Cited

U.S. PATENT DOCUMENTS

2010/0123152 A1* 5/2010 Sugisawa ............ H01L 51/5052
257/98
2015/0270465 A1* 9/2015 Joshi ...................... C22C 1/04
136/239

FOREIGN PATENT DOCUMENTS

| CN | 1888105 | 1/2007 |
| CN | 102386321 | 3/2012 |
| WO | WO2008067815 | 12/2008 |

OTHER PUBLICATIONS

Young et al. "Thermoelectric properties of pure and doped FeMSb (M=V,Nb)" Journal of Applied Physics 87, 317 (2000) (Year: 2000).*

* cited by examiner

*Primary Examiner* — Magali P Slawski
(74) *Attorney, Agent, or Firm* — Jiwen Chen

(57) ABSTRACT

A thermoelectric half-Heusler material comprising niobium (Nb), iron (Fe) and antimony (Sb) wherein the material comprises grains having a mean grain size less than one micron. A method of making a nanocomposite half-Heusler thermoelectric material includes melting constituent elements of the thermoelectric material to form an alloy of the thermoelectric material, comminuting (e.g., ball milling) the alloy of the thermoelectric material into nanometer scale mean size particles, and consolidating the nanometer size particles to form the half-Heusler thermoelectric material comprising at least niobium (Nb), iron (Fe) and antimony (Sb) and having grains with a mean grain size less than one micron.

3 Claims, 9 Drawing Sheets

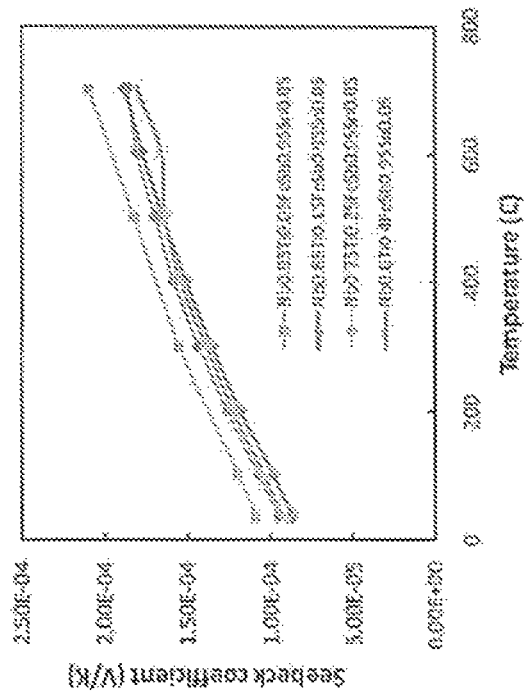
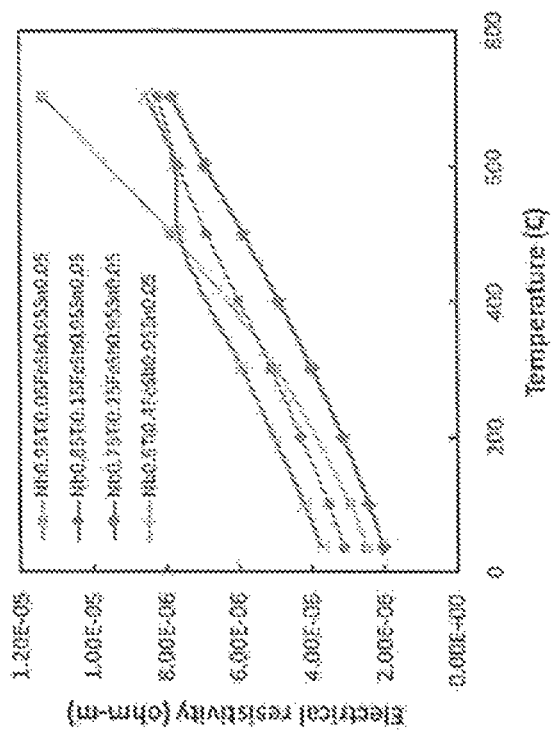
FIG. 3A
FIG. 3B

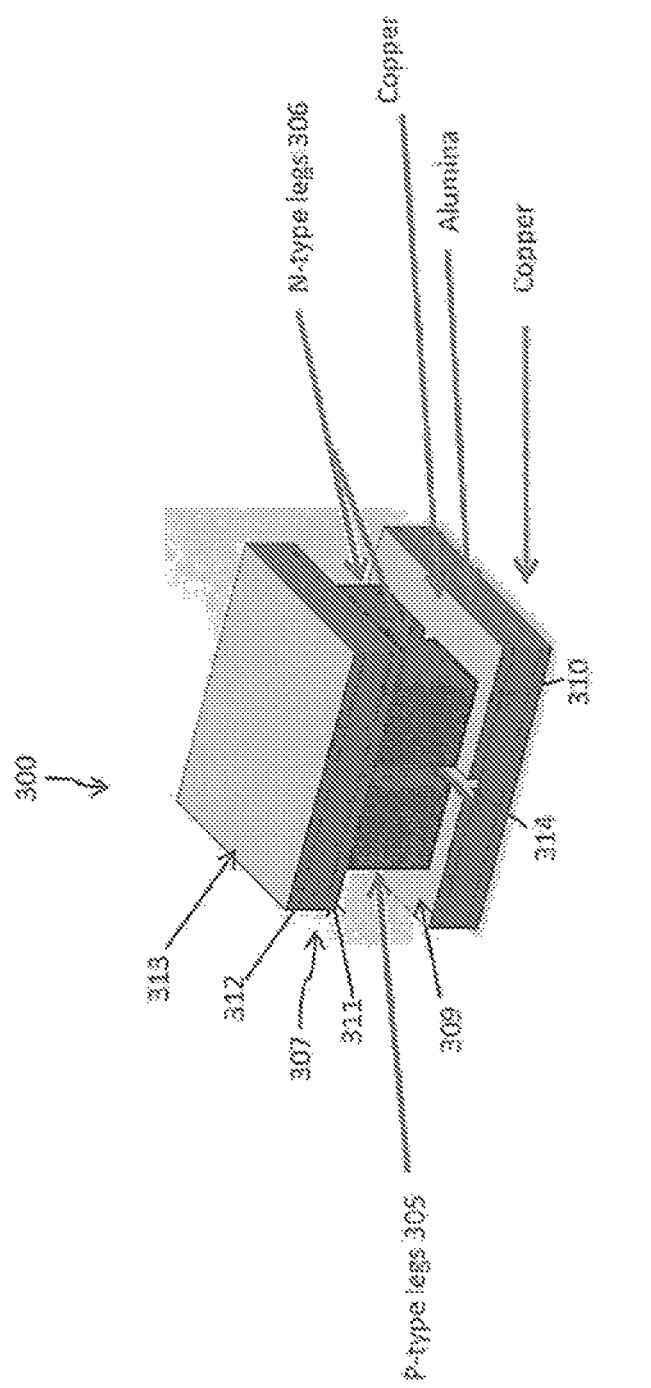

NBFESB-BASED HALF-HEUSLER THERMOELECTRIC MATERIALS AND METHODS OF MAKING

GOVERNMENT SUPPORT

This invention was made with government support under grant number DE-EE0004840 from the U.S. Department of Energy. The government may have certain rights in the invention.

This is a U.S. national stage application of PCT Application No. PCT/CN2014/078513 under 35 U.S.C. 371, filed May 27, 2014 in Chinese, which is hereby incorporated by reference.

FIELD

The present invention is directed to thermoelectric materials and specifically to half-Heusler alloys.

BACKGROUND

Half-Heuslers (HHs) are intermetallic compounds which have great potential as high temperature thermoelectric materials for power generation. However, the dimensionless thermoelectric figure-of-merit (ZT) of HHs is lower than that of the most state-of-the-art thermoelectric materials. HHs are complex compounds, including MCoSb (p-type) and MNiSn (n-type), where M can be Ti or Zr or Hf or combination of two or three of the elements. They form in cubic crystal structure with a F4/3 m (No. 216) space group. These phases are semiconductors with 18 valence electron count (VEC) per unit cell and a narrow energy gap. The Fermi level is slightly above the top of the valence band. The HH phases have a fairly decent Seebeck coefficient with moderate electrical conductivity. The performance of thermoelectric materials depends on ZT, defined by $ZT=(S^2\sigma/\kappa)T$, where $\sigma$ is the electrical conductivity, S the Seebeck coefficient, $\kappa$ the thermal conductivity, and T the absolute temperature, Half-Heusler compounds may he good thermoelectric materials due to their high power factor $(S^2\sigma)$. It has been reported that the MNiSn phases are promising n-type thermoelectric materials with exceptionally large power factors and MCoSb phases are promising p-type materials. In recent years, different approaches have been reported that have improved the ZT of half-Heusler compounds.

SUMMARY

Embodiments include a thermoelectric half-Heusler material comprising niobium (Nb), iron (Fe) and antimony (Sb) wherein the material comprises grains having a mean grain size less than one micron.

In various embodiments, at least a portion of the antimony in the half-Heusler material may be substituted with tin (Sn). In embodiments, at least a portion of the niobium in the half-Heusler material may be substituted with one or more of titanium (Ti), zirconium (Zr), hafnium (Hf), vanadium (V), tantalum (Ta), chromium (Cr), molybdenum (Mo), tungsten (W), and a rare earth element, such as scandium (Sc) and yttrium (Y). In embodiments, at least a portion of the iron in the half-Heusler material may be substituted with cobalt (Co).

In some embodiments, up to about 50 At % (e.g., 5-50 At %, such as 25-40 At %) of the niobium in the half-Heusler material may he substituted with titanium (Ti). In embodiments, up to about 20 At % (e.g., 0-10 At %) of the antimony in the half-Heusler material may be substituted with tin (Sn). For example, embodiments may include a half-Heusler material with the formula $Nb_{1+\delta-x}Ti_xFe_{1-y}Co_ySb_{1+\delta-z}Sn_z$, where $0 \le x \le 0.5$, including x=0, 0.05, 0.1, 0.15, 0.25, 0.4 and 0.5 (e.g., $0 \le x \le 0.05$, $0.05 \le x \le 0.15$, $0.1 \le x \le 0.25$, $0.25 \le x \le 0.4$ and $0.4 \le x \le 0.5$), $0 \le y < 1.0$ (e.g., $0 < y < 1.0$, $0 < y \le 0.25$, $0.25 \le y \le 0.5$, $0.5 \le y < 1.0$) and $0 \le z \le 0.2$, including z=0, 0.025, 0.05, 0.1 and 0.2 (e.g., $0 \le z \le 0.025$, $0.025 \le z \le 0.05$, $0.05 \le z \le 0.1$ and $0.1 \le z \le 0.2$), and $-0.1 \le \delta \le 0.1$.

In various embodiments, the material may be a p-type half-Heusler material with the formula $Nb_{1+\delta-x}A_xFe_{1-y}Co_ySb_{1+\delta-z}Sn_z$ where A comprises one or more of titanium (Ti), zirconium (Zr), hafnium (Hf), vanadium (V), tantalum (Ta), chromium (Cr), molybdenum (Mo), tungsten (W), and a rare earth clement, such as scandium (Sc) and yttrium (Y), and $0 \le x < 1.0$, $0 \le y < 1.0$, $0 \le z < 1.0$, and $-0.1 \le \delta \le 0.1$, such as where $0 < x \le 0.5$, $0 \le y < 1.0$, $0 \le z \le 0.2$, and $-0.1 \le \delta \le 0.1$.

Further embodiments include a method of making a nanocomposite half-Heusler thermoelectric material that includes melting constituent elements of the thermoelectric material to form an alloy of the thermoelectric material, comminuting (e.g., ball milling) the alloy of the thermoelectric material into nanometer scale mean size particles, and consolidating the nanometer size particles to form the half-Heusler thermoelectric material comprising niobium (Nb), iron (Fe) and antimony (Sb) and having grains with a mean grain size less than one micron.

Further embodiments include a thermoelectric half-Heusler material comprising the formula $Nb_{1+\delta-x}A_xFe_{1-y}Co_ySb_{1+\delta-z}Sn_z$ where A comprises one or more of titanium (Ti), zirconium (Zr), hafnium (Hf), vanadium (V), tantalum (Ta), chromium (Cr), molybdenum (Mo), tungsten (W), and a rare earth element, such as scandium (Sc) and yttrium (Y), and $0 \le x < 1.0$, $0 \le y < 1.0$, $0 \le z < 1.0$ and $-0.1 \le \delta \le 0.1$, and wherein at least one of: (i) A comprises titanium (Ti), and a portion (e.g., up to 50 At %, such as 5-40 At %) of the niobium (Nb) in the half-Heusler material is substituted with Ti, and (ii) a portion of the antimony (Sb) (e.g., up to 20 At %) in Lite half-Heusler material is substituted with tin (Sb) (i.e., $0 < z \le 0.2$, including $0 < z \le 0.05$). In various embodiments, a portion of the iron (Fe) in the half-Heulser material is substituted with cobalt (Co) (i.e., $0 < y < 1.0$).

BRIEF DESCRIPTION OF THE DRAWINGS

FIGS. 68 and 6C are plots illustrating resistance scans for a p-type (FIGS. 6B) and n-type (FIG. 6C) thermoelectric legs showing low contact resistance between the respective thermoelectric legs and metal (copper) contacts at opposite ends of the legs.

DETAILED DESCRIPTION

Figure 1:
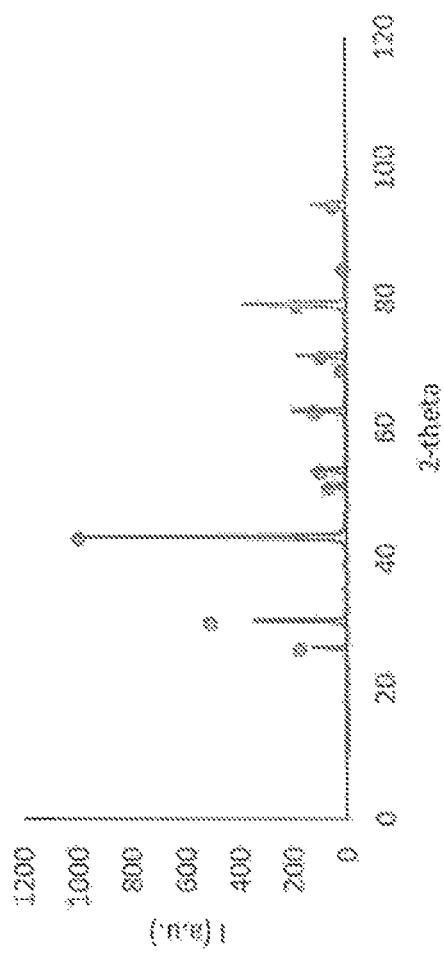
FIG. 1 illustrates the x-ray diffraction (XRD) pattern of an as-pressed sample of $Nb_{0.75}Ti_{0.25}FeSb_{0.95}Sn_{0.05}$ material in an embodiment.

As discussed above, n-type and p-type half-Heusler thermoelectric materials, such as MNiSn (n-type) and MCoSb (p-type) materials, where M=Hf, Zr and/or Ti, are promising thermoelectric materials that exhibit high mechanical strength, thermal stability, low toxicity, and improved thermoelectric performance (e.g., ZT), particularly over a temperature range (e.g., 20-700° C.) useful in many low- to mid-temperature applications, such as waste heat recovery in automobiles.

The cost of these materials depends largely on the hafnium content of the material, since hafnium is significantly more expensive than the other constituents of the material. Thus, materials with similar performance characteristics but without the same high material costs are desirable.

Embodiments include a p-type thermoelectric half-Heusler material comprising niobium (Nb), iron (Fe) and antimony (Sb) wherein the material comprises grains having a mean grain size less than one micron. A peak ZT of 0.99 was achieved at 700° C., which is comparable to the ZT values of p-type MCoSb materials, where M=Hf with Zr and/or Ti, as disclosed in US. Published Patent Application No. 2013/0175484 to Ren et al., which is incorporated by reference herein. In an embodiment, the material may be made by comminuting (e.g., ball milling) a solid alloy (e.g., ingot) having a composition $Nb_{1+\delta-x}A_xFe_{1-y}Co_ySb_{1+\delta-z}Sn_z$ where A comprises one or more of titanium (Ti), zirconium (Zr), hafnium (Hf), vanadium (V), tantalum (Ta), chromium (Cr), molybdenum (Mo), tungsten (W), and a rare earth element, such as scandium (Sc) and yttrium (Y), and $0 \leq x<1.0$, $0 \leq y<1.0$, $0 \leq z<1.0$, and $-0.1 \leq \delta \leq 0.1$, into nanopowders and consolidating the powders, such as via hot pressing, into dense bulk samples. The solid alloy (e.g., ingot) may be formed by arc melting and/or induction melting of the constituent elements. In various embodiments, the consolidated dense bulk samples are nanostructured with grains having a mean grain size less than 300 nm in which at least 90% of the grains are less than 500 nm in size. In an embodiment, the grains may have a mean size in a range of 10-300 nm, including a mean size of around 200 nm. Typically, the grains have random orientations. Further, many grains may include 10-50 nm size (e.g., diameter or width) nanodot inclusions within the grains. Without wishing to be bound by theory, the inventors believe that enhanced ZT values for the half-Heulser material may be due in part to the grain structure of the material producing a reduction of thermal conductivity due to increased phonon scattering at grain boundaries and crystal defects, as well as optimization of antimony doping.

The solid alloy may be made by arc melting individual elements of the thermoelectric material in the appropriate ratio to form the desired thermoelectric material. Alternatively, the solid alloy may be made by induction melting the individual elements of the thermoelectric material in the appropriate ratio. Preferably, the individual elements are 99.0% pure. More preferably, the individual elements are 99.9% pure. In an alternative embodiment, two or more of the individual elements may first be combined into an alloy or compound and the alloy or compound used as one of the starting materials in the arc melting or induction melting process.

In an embodiment, the solid alloy (e.g., melted ingot) may be annealed at elevated temperature (e.g., 600-800° C., such as about 700° C.) in a sub-atmospheric (e.g., vacuum) environment at a pressure of less than 760 Torr (e.g., less than 25 Torr, such as $10^{-3}$–25 Torr). The alloy may be annealed for 0.5-3 days, such as about 24 hours, prior to ball milling.

In an embodiment, the solid alloy may be ball milled for 1-20 hours (e.g., 1-10 hours) in an inert gas (e.g., argon) environment. In embodiments, the ball milling may result in a nanopowder with nanometer size particles that have a mean size less than 1000 nm in which at least 90% of the particles are less than 250 nm in size. In another embodiment, the nanometer size particles have a mean particle size in a range of 5-100 nm.

In an embodiment, the nanometer size particles may be consolidated by loading the particles into a die cavity of a hot press apparatus and hot pressing the particles at an elevated temperature (e.g., peak temperature of 700-1100° C., such as about 900° C.) and pressure (e.g., 60-200 Mpa) to form a sintered body of the thermoelectric material comprised of a plurality of grains. The inventors have discovered that the figure of merit (ZT) of thermoelectric materials improves as the grain size in the thermoelectric material decreases. In one embodiment of the method, thermoelectric materials with nanometer scale (less than 1 micron) grains are produced, i.e., 95%, such as 100% of the grains have a grain size less than 1 micron. Preferably, the nanometer scale mean grain size is in a range of 10-300 nm. Embodiments of the method may be used to fabricate a p-type half-Heusler thermoelectric material having the formula $Nb_{1+\delta-x}A_xFe_{1-y}Co_ySb_{1+\delta-z}Sn_z$ where A comprises one or more of titanium (Ti), zirconium (Zr), hafnium (Hf), vanadium (V), tantalum (Ta), chromium (Cr), molybdenum (Mo), tungsten (W), and a rare earth element, such as scandium (Sc) and yttrium (Y), and $0 \leq x<1.0$, $0 \leq y<1.0$, $0 \leq z<1.0$ and $-0.1 \leq \delta \leq 0.1$ (to allow for slightly non-stoichiometric material), such as $Nb_{1+\delta-x}A_xFe_{1-y}Co_ySb_{1+\delta-z}Sn_z$, where $0 \leq x<1.0$, $0 \leq y<1.0$, $0 \leq z<1.0$ when $\delta=0$ (i.e., for the stoichiometric material).

Embodiments of the half-Heusler materials may include varying amounts of Nb, Ti, Zr, Hf, V, Ta, Cr, Mo, W, one or more rare earth elements, Fe, Co, Sb and/or Sn. Example p-type materials include, but are not limited to $Nb_{1+\delta-x}Ti_xFe_{1-y}Co_ySb_{1+\delta-z}Sn_z$ with $0 \leq x \leq 0.5$ (including $0.05 \leq x \leq 0.4$), $0 \leq y<1.0$, $0 \leq z \leq 0.2$ (including $0<z \leq 0.1$) and $-0.1 \leq \delta \leq 0.1$.

The following examples of methods and thermoelectric materials of the present invention. These examples are illustrative and not meant to be limiting.

EXAMPLES

The p-type half-Heusler materials were prepared by melting niobium, titanium, iron, antimony and tin pieces according to compositions $Nb_{0.75}Ti_{0.25}FeSb_{1-z}Sn_z$ ($0 \leq z \leq 0.2$) and $Nb_{1-x}Ti_xFeSb_{0.975}Sn_{0.025}$ ($0 \leq x \leq 0.4$) (15-50 g/batch) using an arc melting process to produce solid ingots. The ingots were then annealed at 700° C. in a vacuum sealed quartz tube for 24 hours. The annealed ingots were then ball milled for approximately 7 hours in an inert gas (e.g., argon)

environment to get the desired nanopowders with a commercially available ball milling machine (SPEX 8000D Mixer/Mill). The mechanically prepared nanopowders were then hot pressed at temperatures of ~900° C. and pressures of 60-120 Mpa into disks of 12.7 mm diameter and 1-5 mm thickness to produce nanostructured bulk half-Heusler samples.

The samples were characterized by X-ray diffraction (XRD). FIG. 1 shows the XRD pattern of an as-pressed sample of $Nb_{0.75}Ti_{0.25}FeSb_{0.95}Sn_{0.05}$ material, and the diffraction peaks are well-matched with those of hall-Heusler phases/structure.

The nanostructured bulk samples were formed into 12.7 mm diameter discs with appropriate thickness for thermal diffusivity and Hall coefficient measurements, and smaller (e.g., ~2 mm thick) samples for electrical conductivity and Seebeck coefficient measurements. The electrical resistivity and Seebeck coefficient were measured by commercial equipment (e.g., ZEM-3, Ulvac), the thermal diffusivity was measured by a laser flash system (e.g., LFA 457, Netzsch) from room temperature to 700° C., the carrier concentration and mobility at room temperature were tested from Hall measurements, and the specific heat capacity was measured on a differential scanning calorimeter (e.g., DSC-404 C, Netzsch Instruments, Inc.). The thermal conductivity was calculated as the product of the thermal diffusivity, specific heat capacity, and volumetric density of the samples.

Figures 2A, 2B:
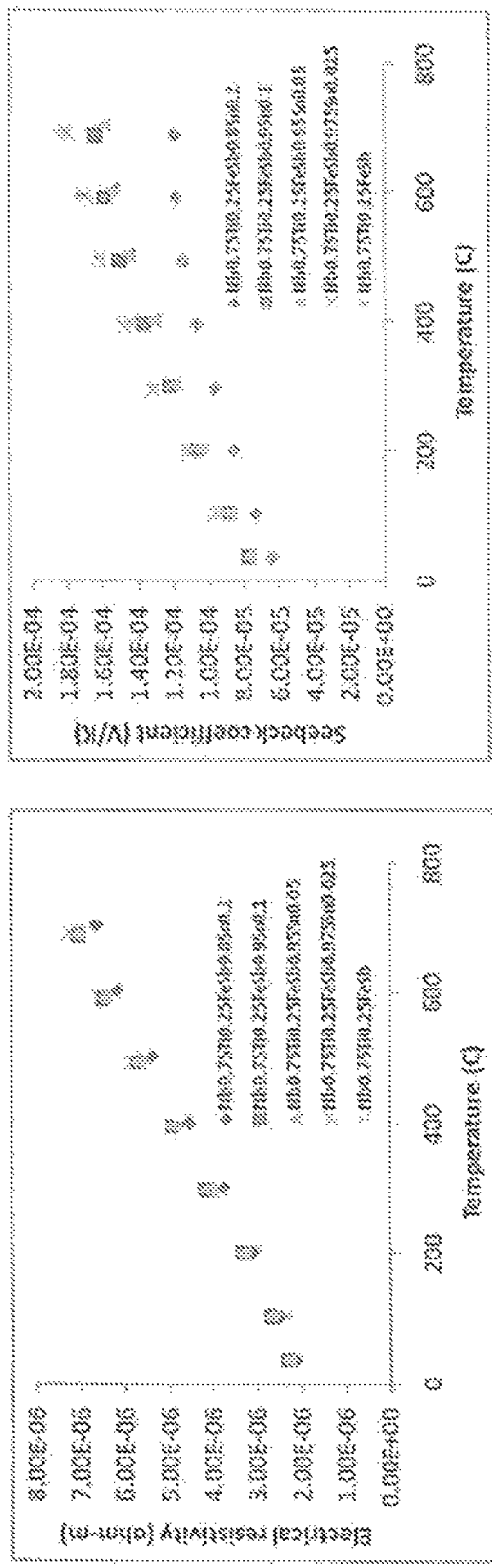
FIGS. 2A-D illustrate the temperature dependent electrical resistivity (FIG. 2A), Seebeck coefficient (FIG. 2B), thermal conductivity (FIG. 2C), and dimensionless figure of merit ZT (FIG. 2D) of ball milled and hot pressed nanostructured samples with a composition of $Nb_{0.75}Ti_{0.25}FeSb_{1-z}Sn_z$ where z=0, 0.025, 0.05, 0.1 and 0.2.
Figures 2C, 2D:
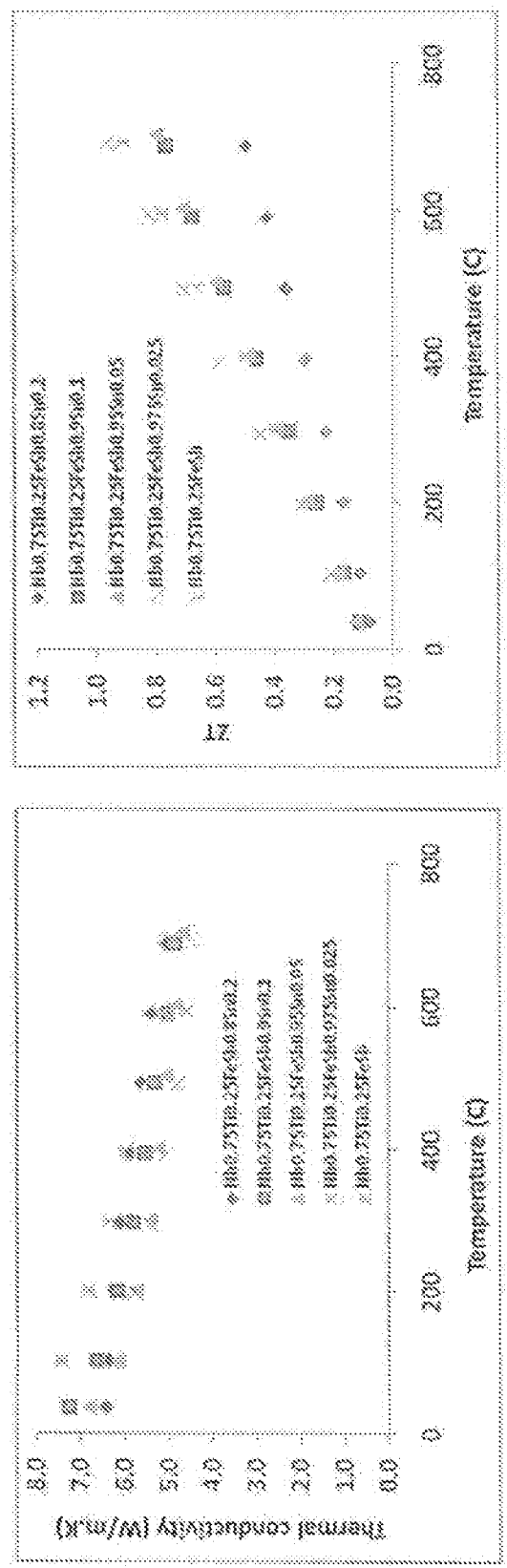

FIGS. 2A-D show the temperature dependent electrical resistivity (FIG. 2A), Seebeck coefficient (FIG. 2B), thermal conductivity (FIG. 2C), and ZT (FIG. 2D) of five ball milled and hot pressed nanostructured samples with a composition of $Nb_{0.75}Ti_{0.25}FeSb_{1-z}Sn_z$ where z =0, 0.025, 0.05, 0.1 and 0.2. As is seen in FIG.2A, the electrical resistivity is nearly independent of the Sb/Sn ratio. Reducing the Sn concentration tends to result in an increase in Seebeck coefficient (see FIG. 2B). The thermal conductivity is decreased with a decrease in the amount of Sn (i.e., z=0.05, 0.025) but increases slightly when there is no Sn (i.e., z=0). A peak ZT of 0.96 at 700° C. is observed for the $Nb_{0.75}Ti_{0.25}FeSb_{0.975}Sn_{0.025}$ sample, which is comparable to the p-type (Hf, Zr, Ti)CoSb materials in U.S. Published Patent Application No. 2013/0175484 to Ren et al. All five samples have ZT values greater than 0.4 for at least one temperature greater than 400° C. Four of the samples (i.e., z=0, 0.025, 0.05 and 0.1) have a ZT greater than 0.6 for at least one temperature in the range 600-800° C., and two of the samples (i.e., z=0 and 0.025) have a ZT greater than 0.8 for at least one temperature in the range 600-800° C. Embodiment materials may have a ZT of 0.9 or more (e.g., 0.9-0.97) at 700° C.

FIG. 3A-3D show the temperature dependent electrical resistivity (FIG. 3A), Seebeck coefficient (FIG. 3B), thermal conductivity (FIG. 3C), and ZT (FIG. 3D) of five ball milled and hot pressed nanostructured samples with a composition of $Nb_{1-x}Ti_xFeSb_{0.975}Sn_{0.025}$ where x=0.05, 0.15, 0.25 and 0.4. An additioal sample with x=0 (i.e., no titanium) was prepared and tested. The results of the x=0 sample are not shown in FIGS. 3A-D because the resistivity of the sample was found to be very high and thus for clarity the results of this sample are not shown in comparison with the data from other samples. The electrical resistivity (FIG. 3A) and thermal conductivity (FIG. 3C) is decreased with an increase in Ti content. Very little difference is observed in the temperature dependent ZT values for the x=0.25 and x=0.4 samples. A peak ZT of about 1.0 at 700° C. is observed for the $Nb_{0.75}Ti_{0.25}FeSb_{0.95}Sn_{0.05}$ $Nb_{0.6}Ti_{0.4}FeSb_{0.95}Sn_{0.05}$ samples, which is comparable to the p-type (Hf, Zr, Ti)CoSb materials in U.S. Published Patent Application No. 2013/0175484 to Ren et al. All four of the illustrated samples (i.e., x0.05, 0.15, 0.25, 0.4) have ZT values great 0.4 for at least one temperature greater than 400° C., and a ZT greater than 0.6 for at least one temperature in the range 600-800° C. Two of the samples (i.e., x=0.25 and 0.4) have a ZT greater than 0.8 for at least one temperature in the range 600-800° C. Embodiment materials have a ZT of 0.9 or more (e.g., 0.9-0.99) at 700° C.

Since the size of the nanoparticles is useful in reducing the thermal coductivity to achieve higher ZT values, it may be possible to further increase ZT of the p-type NbFeSb-based half-Heusler compounds by making the even smaller. For example, a mean grain size less than 100 nm may be produced by preventing grain growth during hot-press with a grain growth inhibitor. Exemplary growth inhibitors include, but are not limited to, oxides (e.g., $Al_2O_3$), carbides (e.g., SiC), nitrides (e.g., AlN) and carbonates (e.g., $Na_2CO_3$). Further improvement in ZT may be possible by further optimizing the Nb/Ti ratio and/or by substituting different elements on other positions of the half-Heusler crystal structure (e.g., partial substitutions of Zr or other elements on the Nb site, partial substitution of Co on the Fe site).

FIG. schemancally illustrates a thermoelectric device 300 fabricated with a nanocomposite p-type NbFeSb-based half-Heulser thermoelectric material as described above and an n-type MNiSn-based half-Heusler thermoelectric material (M=Hf, Zr and/or Ti)The n-type half-Heusler material may be a material having a relatively low hafnium content, such as the materials described in Chen et al., "Effect of Hf Concentration on Thermoelectric Properties of Nanostructured N-Type Half-Heusler Materials $Hf_xZr_{1-x}NiSn_{0.99}Sb_{0.01}$," Advanced Energy Materials 3 (2013), pp. 1210-14 and Joshi et al., "Enhancement of thermoelectric figure-of-merit at low temperatures by titanium substitution for hafnium in n-type half-Heuslers $Hf_{0.75-x}Ti_xZr_{0.25}NiSn_{0.99}Sb_{0.01}$," Nano Energy 2 (2013), pp. 82-87, both of which are incorporated by reference herein for all purposes.

Figure 4:
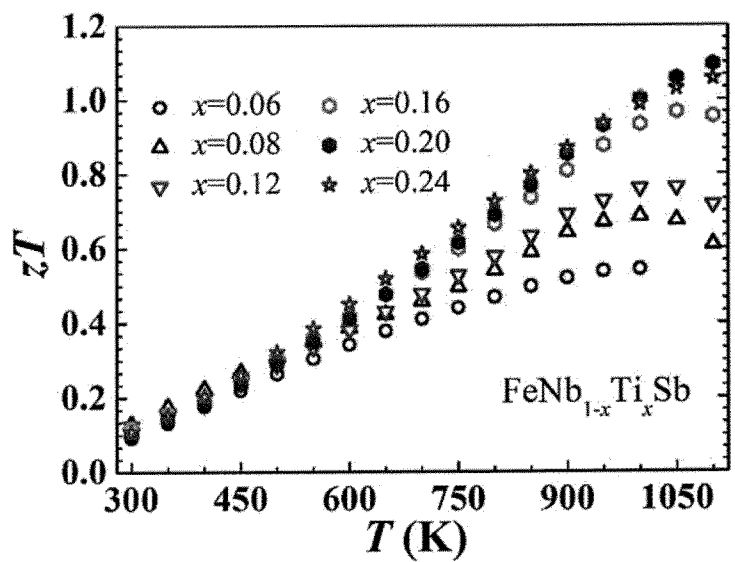
FIG. 4 schematically illustrates a thermoelectric device fabricated with a nanocomposite NbFeSb-based Half-Heulser thermoelectric material in an embodiment.

The device 300 includes a plurality of pairs of p-type thermoelectric material legs 305 and n-type thermoelectric material legs 306. Each pair of legs 305, 306 are thermally and electrically coupled at a first (e.g., hot) end, e.g., to form a junction such as a p/n junction or p-metal-n junction. The junction can be a header 307 made of an electrically conductive material, such as a metal (e.g., copper). Electrical connectors 309, 310 (which may be metal connectors that are the same as or different than the headers 307) may be connected to the second (cold) ends of the thermoelectric legs 305, 306, and may be laterally offset from the header connector 307 such that for each pair of n-type and p-type legs, one leg 305 (e.g., a p-type type leg) contacts a first connector 309, and the other leg 306 (e.g., an n-type leg) contacts a second connector 310. Thus, any arbitrary number of thermoelectric material leg pairs (i.e., "couples") may be electrically connected in series or in parallel by respective (hot side) headers 307 and (cold side) connectors 309, 310, as shown in FIG. 4. A plurality of interconnected leg pairs or "couples" may be packaged in a module that generates electric power from a temperature gradient between a hot and a cold side of the module.

In embodiments, the metal headers 307 may include an electrically conductive material 311 (e.g., metal, such as copper) on a first (e.g., bottom) surface of the header 307 that faces the thermoelectric legs 305, 306, and an electrically insulating material 312 (e.g., a ceramic, such as alumina) adjacent to the electrically conductive material 311 opposite the legs 305, 306 to provide electrical isolation between the leg couples and a module packaging, which may include a metal cover (not shown) mounted over the couples. In embodiments, the header 307 may have layered structure, such as a metal/ceramic/metal sandwich structure. For example, the top layer 313 of the header 307 in FIG. 4 may be a metal (e.g., copper) layer that is separated from metal layer 311 by an intermediate ceramic layer 312. Similarly, the connectors 309, 310 on the "cold" sides of the legs may also include a metal/ceramic or metal/ceramic/metal sandwich structure. The metal layers 309, 310, 311 contacting the 305, 306 may be patterned (e.g., as illustrated by gap 314 between metal contact layers 309 and 310 in FIG. 4) to provide a desired circuit path across the plurality of thermoelectric legs 305, 306.

In are example device 300 fabricated in accordance with FIG. 4, the p-type legs 305 comprise half-Heusler material having the formula $Nb_{0.75}Ti_{0.25}FeSb_{0.9}Sn_{0.1}$ and made in accordance with the nanocomposite technique described above. The n-type legs 306 comprise half-Heusler material having the formula $Hf_{0.25}Zr_{0.75}NiSb_{0.99}Sn_{0.01}$ and made as described in Chen et al., Advanced Energy Materials 3 (2013), pp. 1210-14, which is incorporated by reference herein. The hot pressed p-type and n-type half-Heusler materials were diced into legs 305, 306 of size 1.8 mm×1.8 mm×2 mm and fabricated into the device 300 shown FIG. 4. The output power from the device 300 was measured with a 100-600° C. temperature gradient between the "hot" and "cold" sides of the device 300 over more than >500 thermal cycles.

Figure 5A:
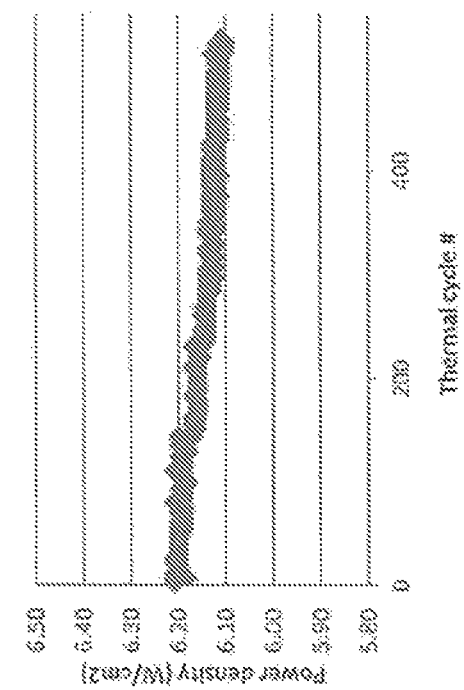
FIGS. 5A-B are plots of the power density (FIG. 5A) and open circuit voltage (FIG. 5B) of an embodiment thermoelectric device measured with 100-600° C. temperature gradient over>500 thermal cycles.
Figure 5B:
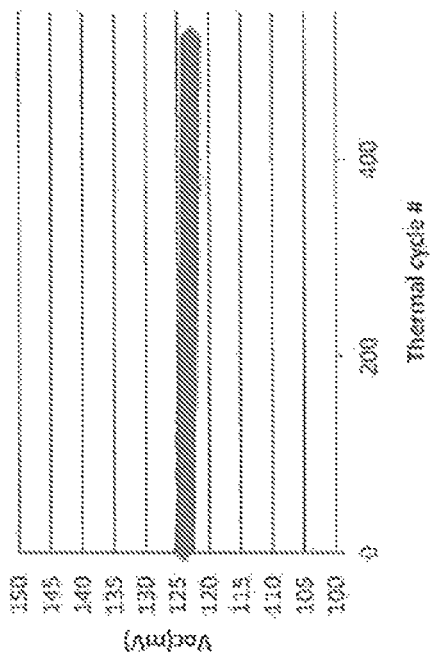

FIG. 5A is a plot of the power density of the devise 300 of FIG. 4 over than 500 thermal cycles. FIG. 5B is a plot of the open circuit voltage (Voc) the device 300 over the >•thermal cycle. The average device resistance was 2 milliohms. The average power density (100-600° C.) was 6.1 W/cm². The average open circuit voltage (100-600° C.) was 121 mV, and the current was 10A for a power of 0.75 W from two pairs of legs. As shown in FIGS. 5A-B, the device 300 performance vas stable within 2% for more than 500 thermal cycles of 100-600° C.

Figure 6B:
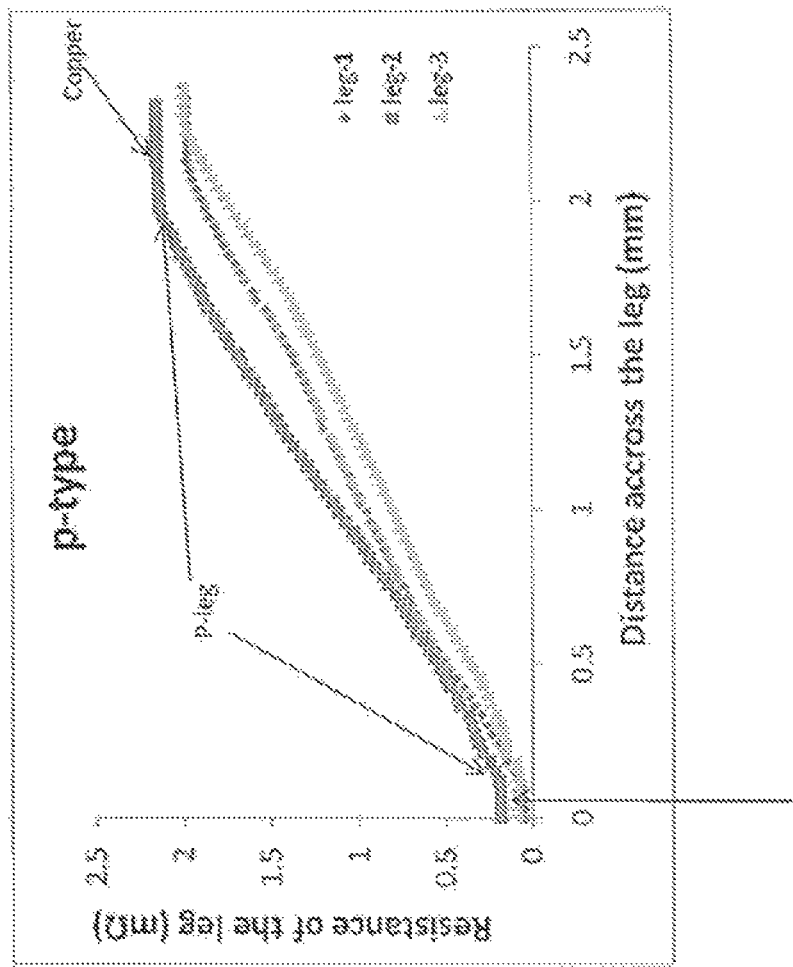
Figure 6A:
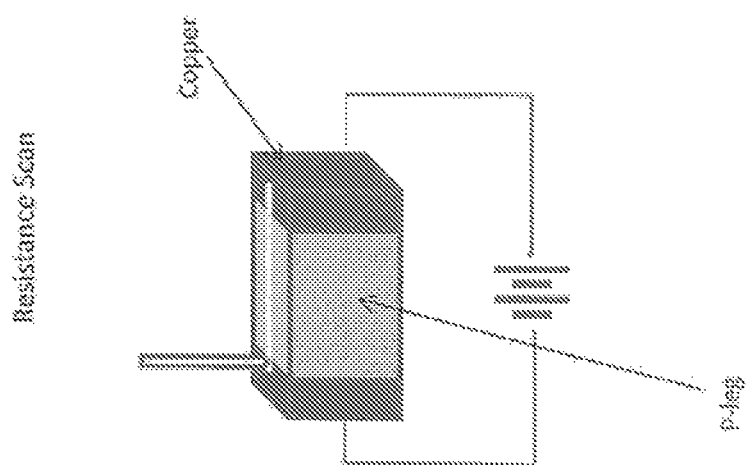
FIG. 6A schematically illustrates a resistance scan for reasuring resistance at various distances along the length of a thermoelectric device.

FIG. 6A schematically illustrates the experimental setup for performing a resistance scan of a thermoelectric devic, such as the device 300 of FIG. 4. A current may be provided through the device via current leads and the voltage drop across sensing terminals may be measured as one of the sensing terminals (e.g., probe) is moved to different positions along the length of the device (e.g., from a first metal (copper) contact, along the length of the p-type and/or n-type thermoelectric material leg, to the second metal (copper) contact). The voltage measured by the probe is proportional to the resistance of the device, and may be used to determine the contact resistance of the device.

Figure 6C:
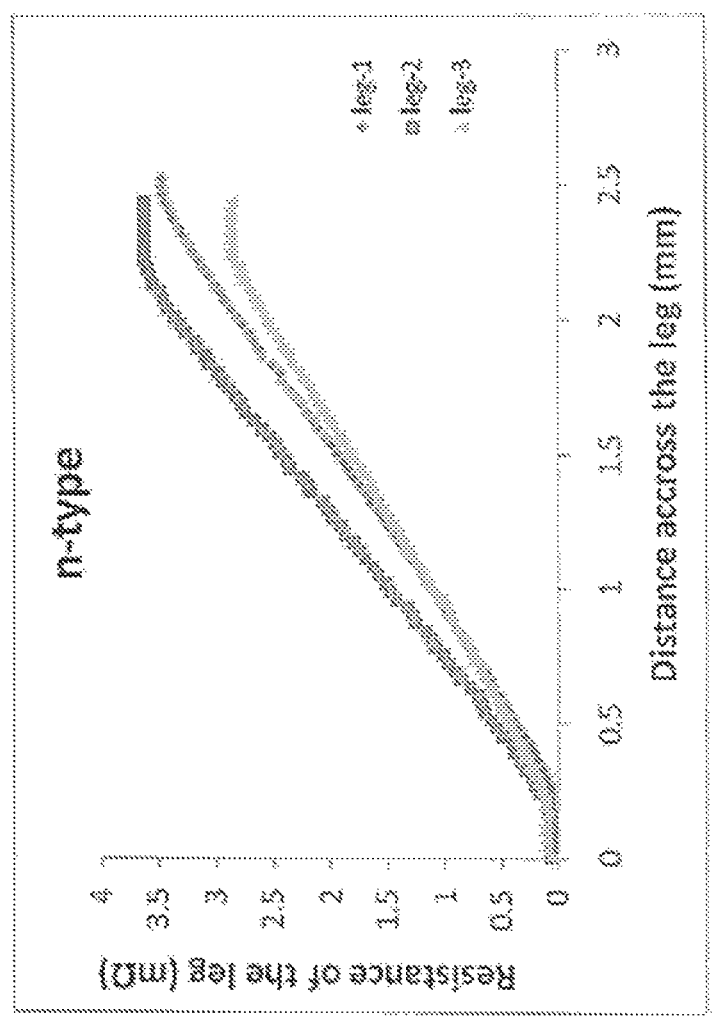
Figure 1:
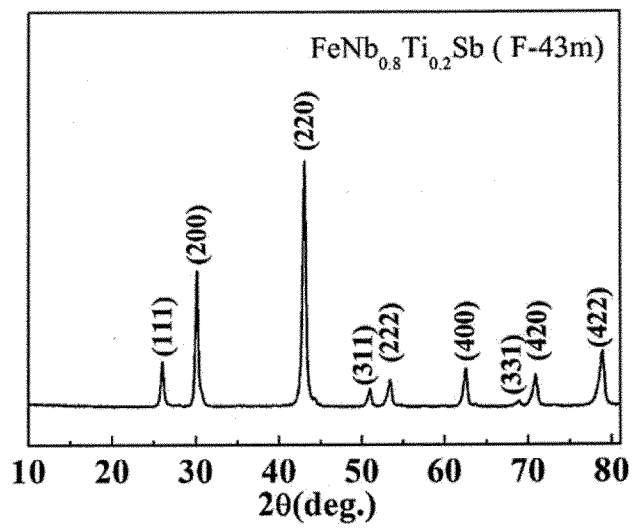

FIG. 6B is a plot of resistance vs. distance for three nanocomposite p-type NbFeSb-based half-Heulser thermoelectric material legs having the same composition and made as described above. The resistance scan of FIG. 6B shows very good contact (i.e., low contact resistance) between the p-type legs and the copper connectors. FIG. 6C is a plot of the resistance vs. distance for three n-type half-Heusler thermoelectric material legs fabricated in accordance with the Chen et al, article described above. The resistance scan of FIG. 6C also shows very good contact (i.e., low contact resistance) between the n-type legs and the copper connectors. Low contact resistance is important for making a device having high power and reliability.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A p-type FeNbTiSb thermoelectric material, whose composition is $FeNb_{1-x}Ti_xSb$, wherein x=0.20 to about 0.24; and the thermoelectric material is obtained by the following method:
   (1) preparing ingots by three-time levitation melting of stoichiometric amounts of Fe, Nb, Ti and Sb under an argon atmosphere;
   (2) mechanically milling the ingots to obtain powders, compacting the powders to obtain the p-type FeNbTiSb thermoelectric material;
   wherein, in step (2), final bulk p-type FeNbTiSb thermoelectric material is sintered by spark plasma sintering at 850° C. for 10 minutes under 65 MPa; and
   wherein particle size of the powder is in the range of 1 μm to about 10 μm.

2. The p-type FeNbTiSb thermoelectric material of claim 1, wherein the composition is x=0.2.

3. A method to prepare a p-type FeNbTiSb thermoelectric material, whose composition is FeNb1−xTixSb, wherein x=0.2 to about 0.24, the process is shown as below:
   (1) preparing ingots by three-time levitation melting of stoichiometric amounts of Fe, Nb, Ti and Sb under an argon atmosphere;
   (2) mechanically milling the ingots to obtain powders, compacting the powders to obtain the p-type FeNbTiSb thermoelectric material,
   wherein, in step (2), final bulk p-type FeNbTiSb thermoelectric material is sintered by spark plasma sintering at 850° C. for 10 minutes under 65 MPa: and
   wherein particle size of the powder is in the range of 1 μm to about 10 μm.

* * * * *

UNITED STATES PATENT AND TRADEMARK OFFICE
CERTIFICATE OF CORRECTION

PATENT NO. : 10,446,732 B2
APPLICATION NO. : 14/900132
DATED : October 15, 2019
INVENTOR(S) : Tiejun Zhu, Chenguang Fu and Xinbing Zhao It is certified that error appears in the above-identified patent and that said Letters Patent is hereby corrected as shown below:

On the Title Page

Item (54), Column 1, Lines 1–3 should be deleted and replaced with the following correct Title:
A HIGH FIGURE OF MERIT P-TYPE FeNbTiSb THERMOELECTRIC MATERIAL AND THE PREPARATION METHOD THEREOF.

Item (57), should be deleted and replaced as follows:
The present invention discloses a type of high figure of merit p-type FeNbTiSb thermoelectric material, whose composition is $FeNb_{1-x}Ti_xSb$, wherein x = 0.06~0.24. The present invention also discloses the method to prepare these p-type FeNbTiSb thermoelectric materials. The ingots with nominal composition $FeNb_{1-x}Ti_xSb$ are prepared by levitation melting of stoichiometric amounts of Fe, Nb, Ti and Sb under an argon atmosphere. The obtained ingots are mechanically milled to get submicron-scale powders. The obtained powders are compacted by spark plasma sintering to obtain the final bulk p-type FeNbTiSb thermoelectric materials. The compositional elements of these p-type FeNbTiSb thermoelectric materials are abundant in the earth crust. The p-type thermoelectric materials also shows good high temperature stability and the preparation method are simple and high-yield. Therefore, the industrial production cost would be relatively cheap. The maximum $zT$ value of the p-type thermoelectric materials is 1.1 at 1100K, which is the highest value among the p-type Half-Heusler system.

Under Abstract "3 Claims, 9 Drawing Sheets" should read --3 Claims, 2 Drawing Sheets--.

In the Drawings

Please delete all the drawings (sheets 1–9) and insert the attached drawings Figs. 1–4 in two sheets, see attached.

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,446,732 B2

In the Specification

Column 1, Line 5 to Column 8, Line 21 should be deleted and replaced with the following:
This is a U.S. national stage application of PCT Application No. PCT/CN2014/078513 under 35 U.S.C. 371, filed May 27, 2014 in Chinese, which is hereby incorporated by reference.

FIELD OF THE TECHNOLOGY
The present invention is directed to thermoelectric materials, and specifically to a high figure of merit p-type FeNbTiSb thermoelectric material and the preparation method thereof.

BACKGROUND OF THE INVENTION
Thermoelectric material, which can reversibly convert heat into electricity through the transport of internal carriers (electrons or holes), is a type of semiconductor material. If there is a temperature difference across the thermoelectric material, heat energy can be converted into electricity, which is called the Seebeck effect. As a contrast, if there is an electric field across the thermoelectric material, the electricity can be converted into heat energy, which leads to heat releasing on one side of the material while the other side will absorb heat energy. This is called the Peltier effect. Herein, thermoelectric materials can be widely used as power generation or cooling application based on the above two effects.
Generation devices made by the thermoelectric materials can be used as the power source of deep spacecraft, fieldwork, ocean lighthouse and nomadic people or directly convert industrial site heat into electricity. Refrigeration devices made by thermoelectric material have many advantages, such as small volume and no need of chemical mediator, which can be applied as local cooling in the fields of mini freezers, computer chips, laser detectors and medical portable ultra-low temperature freezers. A wider application of thermoelectric refrigeration will also include household refrigerators, vehicle or home air conditioners. The devices made by the thermoelectric materials have many advantages such as no mechanical moving parts, no noise, no wear, simple structure and the shape or size can be designed according to the user needs.
The efficiency of a thermoelectric material is gauged by the figure of merit, $zT$, which is defined by:
$zT = (a^2 s T/k)$
where $a$, $s$, $T$ and $k$ are the Seebeck coefficient, electrical conductivity, absolute temperature, and thermal conductivity, respectively.
A good thermoelectric material should have high Seebeck coefficient and electrical conductivity and low thermal conductivity. High performance thermoelectric devices usually consist of high figure of merit n-type and p-type materials which should have close thermoelectric properties and crystal structure.
Nowadays, high-temperature thermoelectric materials have important applications in the fields of automotive industry, site heat recovery and deep space satellites. The typical high-temperature thermoelectric materials are SiGe alloys, which have superior n-type thermoelectric performance with high $zT$ of ~1.0. However, the corresponding p-type SiGe materials have relatively inferior thermoelectric performance with a low $zT$ of ~0.5.
Recently, Half-Heusler compounds, which are consisted of earth-abundant elements, have attracted the attention of researchers in the thermoelectric field due to their excellent electrical properties. Among them, the n-type ZrNiSn-based Half-Heusler compounds display high $zT$ of ~1.0, which is comparable with the best n-type SiGe alloys. However, the p-type Half-Heusler compounds have relatively bad performance, which is a big problem hindering the application of Half-Heusler system as high-temperature power generation.

The raw materials of FeNbTiSb thermoelectric materials are consisted of earth-abundant and low cost elements. However, few studies can be found for this type of thermoelectric materials.

SUMMARY OF THE INVENTION

The present invention provides a type of high figure of merit p-type FeNbTiSb thermoelectric material and the fabrication method thereof. A maximum $zT$ of 1.1 at 1100K can be found for the thermoelectric material.

Solution to The Problem:
The present invention discloses a type of high figure of merit p-type thermoelectric material: FeNbTiSb, which has the formulation of $FeNb_{1-x}Ti_xSb$, where x = 0.06-0.24, x represents the atomic percentage.
Preferably, x = 0.2-0.24; more preferably, x = 0.2.
The present invention also discloses the preparation method of this type of p-type FeNbTiSb thermoelectric material, which is shown as below:
(1) The ingots with nominal composition $FeNb_{1-x}Ti_xSb$ are prepared by levitation melting of stoichiometric amounts of Fe, Nb, Ti, Sb under an argon atmosphere.
(2) The ingots are pulverized and then sintered to obtain the bulk p-type FeNbTiSb thermoelectric materials.
Preferably, in step (1), the ingots are melted three times to ensure homogeneity.
Preferably, in step (2), the particle size of the pulverized powders are in the range of 200nm ~ 10.0μm.
Preferably, in step (2), the powders are sintered by spark plasma sintering at 850° C. for 10 minutes under 65MPa to obtain the bulk p-type FeNbTiSb thermoelectric materials.

Benefits or Advantages of The Present Invention:
Compared with previous results, the benefits for the present invention are as follows:
In the present invention, a type of high figure of merit p-type FeNbTiSb thermoelectric material is reported, which has a maximum $zT$ of 1.1 at 1100K. This result is the highest value among the p-type Half-Heusler compounds.

BRIEF DESCRIPTION OF THE DRAWINGS

Figure 3D:
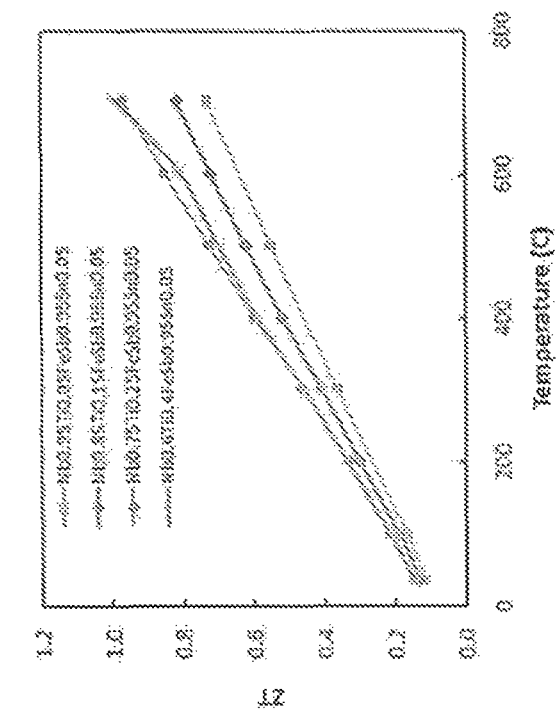
FIGS. 3A-D illustrate the temperature dependent electrical resistivity (FIG. 3A), Seebeck coefficient (FIG. 3B), thermal conductivity (FIG. 3C), and dimensionless figure of merit ZT (FIG. 3D) of ball milled and hot pressed nanostructured samples with a composition of $Nb_{1-x}Ti_xFeSb_{0.95}Sn_{0.05}$ where x=0.05, 0.15, 0.25 and 0.4.
Figure 3C:
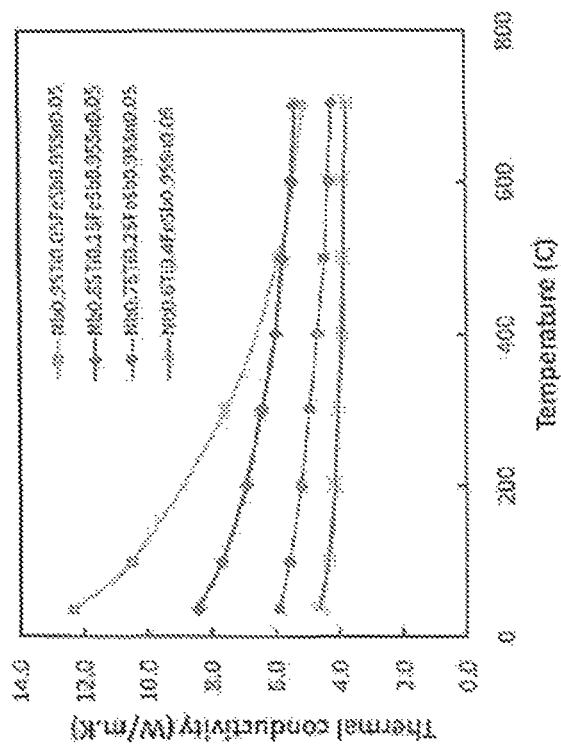
Figure 2:
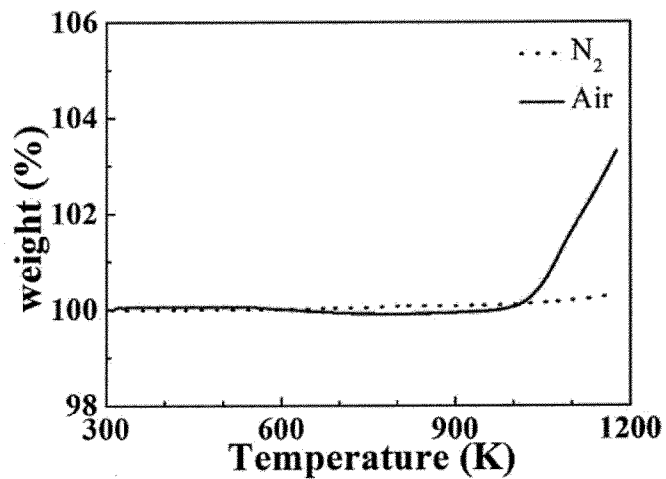
Figure 3:
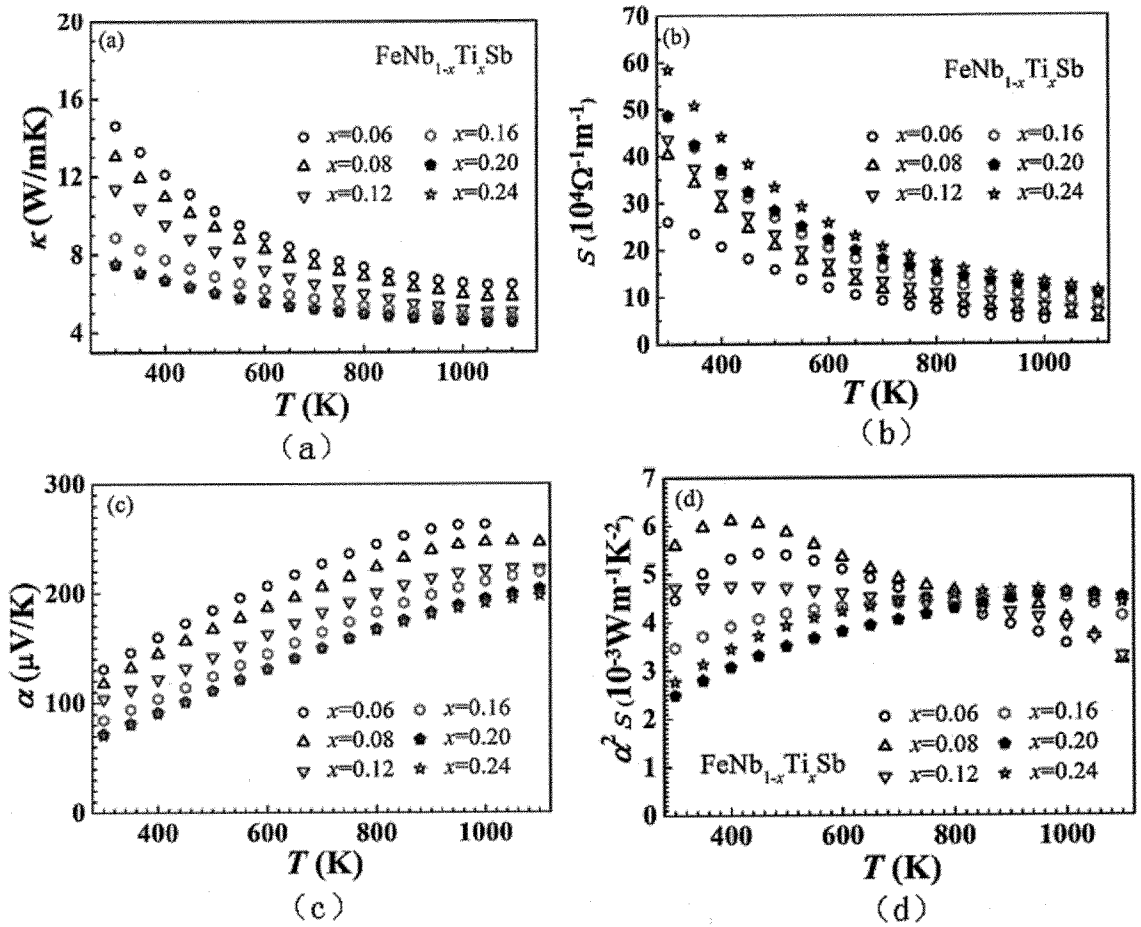

FIG. 1 shows the XRD pattern of $FeNb_{0.8}Ti_{0.2}Sb$.
FIG. 2 shows the thermogravimetric analysis for $FeNb_{0.8}Ti_{0.2}Sb$.
FIG. 3 shows the temperature dependence of thermal conductivity $k$ (a), electrical conductivity $s$ (b), Seebeck coefficient $a$ (c) and power factor $a^2s$ for $FeNb_{1-x}Ti_xSb$.
FIG. 4 shows the temperature dependence of $zT$ value for $FeNb_{1-x}Ti_xSb$.

DETAILED DESCRIPTION OF THE PREFERRED EMBODIMENTS

Based on the embodiments, further elaboration of the present invention is shown as below.
Embodiment 1
The ingot with nominal composition $FeNb_{0.8}Ti_{0.2}Sb$ was prepared by levitation melting of stoichiometric amounts of Fe, Nb, Ti and Sb under an argon atmosphere. The ingot is melted three times to ensure homogeneity. The obtained ingot was mechanically milled to obtain submicron-scale powders. Then, the obtained powders were compacted by spark plasma sintering at 850° C. for 10 minutes under 65MPa to obtain the final bulk material.

Phase structures of the sample was investigated by X-ray diffraction (XRD) on a RigakuD/MAX-2550PC diffractometer. The XRD pattern showed FeNbSb basic structure, a cubic structure (F43m), space group 216, as shown in FIG. 1.

The thermal diffusivity and specific heat of the sample were respectively measured by a laser flash method on a Netzsch LFA457 instrument and a Netzsch DSC-404 instrument. Then the thermal conductivity was calculated. The thermal conductivity $k$ of the sample was 4.5 $Wm^{-1}K^{-1}$ at 1100K. The Seebeck coefficient and electrical conductivity of the sample were measured on a commercial Linseis LSR-3 system. At 1100K, the Seebeck coefficient $a$ was 204 μV/K while the electrical conductivity $s$ was $10.7 \times 10^4$ S/m.

According to the above values and the formula $zT = (a^2 sT/k)$, the $zT$ value of the sample was 1.1 at 1100K.

Thermogravimetric analysis of the sample was carried out respectively in the nitrogen and air atmosphere by employing the DSCQ1000 equipment. The results were showed in FIG.2. The heating rate was 10K/min while the measured temperature ranged from 300K to 1200K. The sample kept stable both under the nitrogen or air atmosphere from 300K to 1000K, indicating good high-temperature stability. The sample still kept stable above 1000K when heating in the nitrogen atmosphere while slight weight gain was found when heating in the air atmosphere, which may result from the surface oxidation.

Embodiment 2
The ingot with nominal composition $FeNb_{0.76}Ti_{0.24}Sb$ was prepared by levitation melting of stoichiometric amounts of Fe, Nb, Ti and Sb under an argon atmosphere. The ingot was melted three times to ensure homogeneity. The obtained ingot was mechanically milled to obtain submicron-scale powders. Then, the obtained powders were compacted by spark plasma sintering at 850° C. for 10 minutes under 65MPa to obtain the final bulk material $FeNb_{0.76}Ti_{0.24}Sb$.

The thermal conductivity $k$ of the sample $FeNb_{0.76}Ti_{0.24}Sb$ 4.6 $Wm^{-1}K^{-1}$ at 1100K.

The Seebeck coefficient $a$ and electrical conductivity $s$ of the sample $FeNb_{0.76}Ti_{0.24}Sb$ were measured on a commercial Linseis LSR-3 system, which were respectively 198 μV/K and $11.3 \times 10^4$ S/m at 1100K.

According to the above values and the formula $zT = (a^2 sT/k)$, the $zT$ value of the sample $FeNb_{0.76}Ti_{0.24}Sb$ was 1.06 at 1100K.

Embodiment 3
The ingot with nominal composition $FeNb_{0.84}Ti_{0.16}Sb$ was prepared by levitation melting of stoichiometric amounts of Fe, Nb, Ti and Sb under an argon atmosphere. The ingot was melted three times to ensure homogeneity. The obtained ingot was mechanically milled to obtain submicron-scale powders. Then, the obtained powders were compacted by spark plasma sintering at 850° C. for 10 minutes under 65MPa to obtain the final bulk material $FeNb_{0.84}Ti_{0.16}Sb$.

The thermal conductivity $k$ of the sample $FeNb_{0.84}Ti_{0.16}$ was 4.8 $Wm^{-1}K^{-1}$ at 1100K.

The Seebeck coefficient $a$ and electrical conductivity $s$ of the sample $FeNb_{0.84}Ti_{0.16}$ were measured on a commercial Linseis LSR-3 system, which were respectively 219 μV/K and $8.6 \times 10^4$ S/m at 1100K.

According to the above values and the formula $zT = (a^2 sT/k)$, the $zT$ value of the sample $FeNb_{0.84}Ti_{0.16}$ was 0.96 at 1100K.

Embodiment 4
The ingot with nominal composition $FeNb_{0.88}Ti_{0.12}Sb$ was prepared by levitation melting of stoichiometric amounts of Fe, Nb, Ti and Sb under an argon atmosphere. The ingot was melted three times to ensure homogeneity. The obtained ingot was mechanically milled to obtain submicron-scale powders. Then, the obtained powders were compacted by spark plasma sintering at 850° C. for 10 minutes under 65MPa to obtain the final bulk material $FeNb_{0.88}Ti_{0.12}Sb$.
The thermal conductivity $k$ of the sample $FeNb_{0.88}Ti_{0.12}Sb$ was 5.1 $Wm^{-1}K^{-1}$ at 1100K.
The Seebeck coefficient $a$ and electrical conductivity $s$ of the sample $FeNb_{0.88}Ti_{0.12}Sb$ were measured on a commercial Linseis LSR-3 system, which were respectively 222 μV/K and $6.7 \times 10^4$ S/m at 1100K.
According to the above values and the formula $zT = (a^2sT/k)$, the $zT$ value of the sample $FeNb_{0.88}Ti_{0.12}Sb$ was 0.72 at 1100K.

Embodiment 5
The ingot with nominal composition $FeNb_{0.92}Ti_{0.08}Sb$ was prepared by levitation melting of stoichiometric amounts of Fe, Nb, Ti and Sb under an argon atmosphere. The ingot was melted three times to ensure homogeneity. The obtained ingot was mechanically milled to obtain submicron-scale powders. Then, the obtained powders were compacted by spark plasma sintering at 850° C. for 10 minutes under 65MPa to obtain the final bulk material $FeNb_{0.92}Ti_{0.08}Sb$.
The thermal conductivity $k$ of the sample $FeNb_{0.92}Ti_{0.08}Sb$ was 5.8 $Wm^{-1}K^{-1}$ at 1100K.
The Seebeck coefficient $a$ and electrical conductivity $s$ of the sample $FeNb_{0.92}Ti_{0.08}Sb$ were measured on a commercial Linseis LSR-3 system, which were respectively 246μV/K and $5.3 \times 10^4$ S/m at 1100K.
According to the above values and the formula $zT = (a^2sT/k)$, the $zT$ value of the sample $FeNb_{0.92}Ti_{0.08}Sb$ was 0.61 at 1100K.

Embodiment 6
The ingot with nominal composition $FeNb_{0.94}Ti_{0.06}Sb$ was prepared by levitation melting of stoichiometric amounts of Fe, Nb, Ti and Sb under an argon atmosphere. The ingot was melted three times to ensure homogeneity. The obtained ingot was mechanically milled to obtain submicron-scale powders. Then, the obtained powders were compacted by spark plasma sintering at 850° C. for 10 minutes under 65MPa to obtain the final bulk material $FeNb_{0.94}Ti_{0.06}Sb$.
The thermal conductivity $k$ of the sample $FeNb_{0.94}Ti_{0.06}Sb$ was 6.5 $Wm^{-1}K^{-1}$ at 1100K.
The Seebeck coefficient $a$ and electrical conductivity $s$ of the sample $FeNb_{0.94}Ti_{0.06}Sb$ were measured on a commercial Linseis LSR-3 system, which were respectively 263μV/K and $5.1 \times 10^4$ S/m at 1100K.
According to the above values and the formula $zT = (a^2sT/k)$, the $zT$ value of the sample $FeNb_{0.94}Ti_{0.06}Sb$ is 0.54 at 1100K.

Comprehensive analysis of the thermoelectric properties for the samples in the above embodiments is shown as below:
The temperature dependence of thermoelectric properties for the samples in the above embodiments 1-6 were measured, which are shown in FIG. 3. It can be seen that the thermal conductivity and Seebeck coefficient of the samples decrease with increasing x while the electrical conductivity of the samples increase with increasing x. The final $zT$ of the samples are then calculated by the formula $zT = (a^2sT/k)$, which are shown in FIG. 4. It is found that the $zT$ of all the samples increases with increasing temperature. As the preferred sample, $FeNb_{0.8}Ti_{0.2}Sb$ displays the maximum $zT$ of 1.1 at 1100K, which is due to its low thermal conductivity (FIG. 3a) and high power factor (FIG. 3d).

Industrial Applicability:

The compositional elements of the p-type FeNbTiSb thermoelectric material in the present invention are abundant in the earth crust. Therefore, the production cost of this material is relatively cheap. The p-type FeNbTiSb thermoelectric material prepared in the present invention shows good high temperature stability and excellent thermoelectric performance. In addition, the preparation method of p-type FeNbTiSb thermoelectric material is simple and high-yield.